(12) United States Patent
Zhang

(10) Patent No.: US 12,262,619 B2
(45) Date of Patent: Mar. 25, 2025

(54) DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Liangfen Zhang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/758,975

(22) PCT Filed: Jul. 1, 2022

(86) PCT No.: PCT/CN2022/103405
§ 371 (c)(1),
(2) Date: Jul. 17, 2022

(87) PCT Pub. No.: WO2023/236296
PCT Pub. Date: Dec. 14, 2023

(65) Prior Publication Data
US 2024/0196696 A1    Jun. 13, 2024

(30) Foreign Application Priority Data
Jun. 7, 2022   (CN) .......................... 202210642017.1

(51) Int. Cl.
*H10K 59/80*   (2023.01)
*H10K 50/824*  (2023.01)
(Continued)

(52) U.S. Cl.
CPC ..... *H10K 59/80522* (2023.02); *H10K 50/824* (2023.02); *H10K 59/1213* (2023.02);
(Continued)

(58) Field of Classification Search
CPC ........... H10K 59/1213; H10K 59/1315; H10K 59/80522; H10K 50/824; H10K 59/122
See application file for complete search history.

(56) References Cited

U.S. PATENT DOCUMENTS

2009/0009069 A1* 1/2009 Takata ................ H10K 59/122
                                                                445/24
2015/0021560 A1   1/2015 Jeong et al.
(Continued)

FOREIGN PATENT DOCUMENTS

CN   101340754 A   1/2009
CN   107039491 A   8/2017
(Continued)

OTHER PUBLICATIONS

International Search Report in International application No. PCT/CN2022/103405, mailed on Dec. 20, 2022.
(Continued)

*Primary Examiner* — Alia Sabur
*Assistant Examiner* — Emily Nicole Farmer
(74) *Attorney, Agent, or Firm* — PV IP PC; Wei Te Chung

(57) ABSTRACT

A display panel and a display device are provided. Each includes a light-emitting device layer including a first conductive layer, an organic layer, and a second conductive layer. The first conductive layer includes a first electrode electrically connected to a pixel driving circuit. The second conductive layer includes a second electrode disposed on a first portion located on the organic layer. The auxiliary structure includes a base, an auxiliary electrode, and an auxiliary portion. A cross-section of the base is trapezoidal in shape. The second electrode exceeds the first portion and is connected to the auxiliary electrode.

20 Claims, 2 Drawing Sheets

(51) Int. Cl.
H10K 59/121 (2023.01)
H10K 59/122 (2023.01)
H10K 59/126 (2023.01)
H10K 59/131 (2023.01)

(52) U.S. Cl.
CPC ......... *H10K 59/122* (2023.02); *H10K 59/126* (2023.02); *H10K 59/131* (2023.02); *H10K 59/1315* (2023.02)

(56) References Cited

U.S. PATENT DOCUMENTS

2016/0043341 A1* 2/2016 Heo ................ H10K 59/122
 438/23
2018/0006264 A1* 1/2018 Lee ................ H10K 71/20

FOREIGN PATENT DOCUMENTS

| CN | 107565048 A | 1/2018 |
| CN | 108538890 A | 9/2018 |
| CN | 111029376 A | 4/2020 |
| CN | 111211243 A | 5/2020 |
| CN | 114122296 A | 3/2022 |

OTHER PUBLICATIONS

Written Opinion of the International Search Authority in International application No. PCT/CN2022/103405, mailed on Dec. 20, 2022.

* cited by examiner

DISPLAY PANEL AND DISPLAY DEVICE

BACKGROUND OF INVENTION

1. Field of Invention

The present application relates to a technical field of displays, and particularly to a display panel and a display device.

2. Related Art

In operation of large-sized organic light-emitting diode (OLED) display panels, due to great cathode resistance, voltages on cathodes in each area of panels are not consistent, resulting in uneven brightness of display screens. A traditional solution is to make additional auxiliary electrodes on backplanes. The cathodes are connected to the auxiliary electrodes in various ways, and the resistance of the cathodes is reduced through parallel connection of the cathodes and the auxiliary electrode, so that entire panel screens can be displayed uniformly.

In prior art, cathodes are generally contact-connected to auxiliary electrodes by means of undercutting, but such a contact-connection is fraught with a problem of being unstable and even difficult to be achieved.

SUMMARY OF INVENTION

Embodiments of the present invention provide a display panel and a display device to solve a problem of unstable contact-connection between cathodes and auxiliary electrodes.

An embodiment of the present invention provide a display panel, including an array substrate including a substrate and a pixel driving circuit layer disposed on the substrate, and the pixel driving circuit layer including a pixel driving circuit; a light-emitting device layer disposed on the pixel driving circuit layer and including a first conductive layer, an organic layer disposed on the first conductive layer, and a second conductive layer disposed on the organic layer. The first conductive layer includes a first electrode electrically connected to the pixel driving circuit, the organic layer includes a first portion, the second conductive layer includes a second electrode disposed on the first portion, and part of the first portion is located between the first electrode and the second electrode. An auxiliary structure is disposed on the pixel driving circuit layer and includes a base, an auxiliary electrode located on an outer side surface of the base, and an auxiliary portion located on the base. Specifically, a cross-section of the base is trapezoidal in shape, and an edge of the second electrode close to the auxiliary portion exceeds an edge of the first portion close to the auxiliary portion and is connected to the auxiliary electrode.

Specifically, an edge of the second electrode close to the auxiliary structure exceeds an edge of the first portion close to the auxiliary structure and is connected to the auxiliary electrode.

Specifically, the base further includes a top surface connected to the outer side surface and disposed opposite to a bottom surface of the base, and the auxiliary electrode covers the top surface and the outer side surface.

In some embodiments, the organic layer further includes a second portion located on the auxiliary portion, the first portion and the second portion are disconnected at an edge of the auxiliary portion, the second conductive layer further includes a disconnected portion disposed on the second portion, and the second electrode and the disconnected portion are disconnected at the edge of the auxiliary portion.

In some embodiments, the second electrode is contact-connected to the auxiliary electrode with a contact-connection area larger than a contact-connection area between the first portion and the auxiliary electrode.

In some embodiments, the auxiliary electrode and the first electrodes are arranged in a same layer and made of a same material.

In some embodiments, the array substrate further includes a planarization layer disposed between the pixel driving circuit layer and the first conductive layer, and the light-emitting device layer further includes a pixel definition layer disposed between the planarization layer and the organic layer. The base and the planarization layer or the pixel definition layer are arranged in a same layer and made of a same material.

In some embodiments, an orthographic projection of an edge of the auxiliary portion on the substrate exceeds a boundary of an orthographic projection of the base on the substrate.

In some embodiments, the orthographic projection of the edge of the auxiliary portion on the substrate exceeds the boundary of the orthographic projection of the base on the substrate by 0.5 microns ($\mu$m) or more, and an orthographic projection of the edge of the second electrode close to the auxiliary structure on the substrate falls within an orthographic projection of the auxiliary portion on the substrate.

In some embodiments, the outer side surface of the base is located at an angle greater than or equal to 30° and less than or equal to 60° with respect to the bottom surface of the substrate.

An embodiment of the present invention further provides a display panel, including an array substrate including a substrate and a pixel driving circuit layer disposed on the substrate, and the pixel driving circuit layer including a pixel driving circuit; a light-emitting device layer disposed on the pixel driving circuit layer and including a first conductive layer, an organic layer disposed on the first conductive layer, and a second conductive layer disposed on the organic layer. The first conductive layer includes a first electrode electrically connected to the pixel driving circuit, the organic layer includes a first portion, the second conductive layer includes a second electrode disposed on the first portion, and part of the first portion is located between the first electrode and the second electrode. An auxiliary structure is disposed on the pixel driving circuit layer and includes a base, an auxiliary electrode located on an outer side surface of the base, and an auxiliary portion located on the base. Specifically, a cross-section of the base is trapezoidal in shape, and an edge of the second electrode close to the auxiliary portion exceeds an edge of the first portion close to the auxiliary portion and is connected to the auxiliary electrode.

In some embodiments, an edge of the second electrode close to the auxiliary structure exceeds an edge of the first portion close to the auxiliary structure and is connected to the auxiliary electrode.

In some embodiments, the organic layer further includes a second portion located on the auxiliary portion, the first portion and the second portion are disconnected at an edge of the auxiliary portion, the second conductive layer further includes a disconnected portion disposed on the second portion, and the second electrode and the disconnected portion are disconnected at the edge of the auxiliary portion.

In some embodiments, the second electrode is contact-connected to the auxiliary electrode with a contact-connection area larger than a contact-connection area between the first portion and the auxiliary electrode.

In some embodiments, the auxiliary electrode and the first electrodes are arranged in a same layer and made of a same material.

In some embodiments, the base further includes a top surface connected to the outer side surface and disposed opposite to a bottom surface of the base, and the auxiliary electrode covers the top surface and the outer side surface.

In some embodiments, the array substrate further includes a planarization layer disposed between the pixel driving circuit layer and the first conductive layer, and the light-emitting device layer further includes a pixel definition layer disposed between the planarization layer and the organic layer. The base and the planarization layer or the pixel definition layer are arranged in a same layer and made of a same material.

In some embodiments, an orthographic projection of an edge of the auxiliary portion on the substrate exceeds a boundary of an orthographic projection of the base on the substrate.

In some embodiments, the orthographic projection of the edge of the auxiliary portion on the substrate exceeds the boundary of the orthographic projection of the base on the substrate by 0.5 microns (μm) or more, and an orthographic projection of the edge of the second electrode close to the auxiliary structure on the substrate falls within an orthographic projection of the auxiliary portion on the substrate.

In some embodiments, the cross-section of the auxiliary portion is inverted trapezoidal in shape or rectangular in shape.

In some embodiments, the outer side surface of the base is located at an angle greater than or equal to 30° and less than or equal to 60° with respect to the bottom surface of the substrate.

An embodiment of the present invention further provides a display device including the above-mentioned display panel.

The present invention has advantageous effects as follows: embodiments of the present invention provide the display panel and the display device. The cross-section of the base is trapezoidal in shape, which can improve contact-connection probability of the second electrode and the auxiliary electrode. The disposition of the second electrode exceeding the edge of the first portion close to the auxiliary portion and connected to the auxiliary electrode can reduce the resistance of the second electrode and improve uneven display of large-sized panels due to a voltage drop caused by cathode impedance.

BRIEF DESCRIPTION OF DRAWINGS

In order to better illustrate the technical solutions in the embodiments of the present invention, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The technical solutions in the embodiments of the present invention will be clearly and completely described below in conjunction with the drawings in the embodiments of the present invention. Obviously, the described embodiments are only some, but not all, embodiments of the present invention. Based on the embodiments in this invention, all other embodiments obtained by those skilled in the art without creative work shall fall within the protection scope of this invention. In addition, it should be understood that the specific embodiments described here are only used to illustrate the present invention, and are not used to limit the present invention. In this invention, if no explanation is made to the contrary, the orientation words used, such as "upper" and "lower" usually refer to the upper and lower positions of the device in actual use or working state. Specifically, they refer to the direction of the drawings, and "inner" and "outer" refer to the outline of the device.

Figure 1:
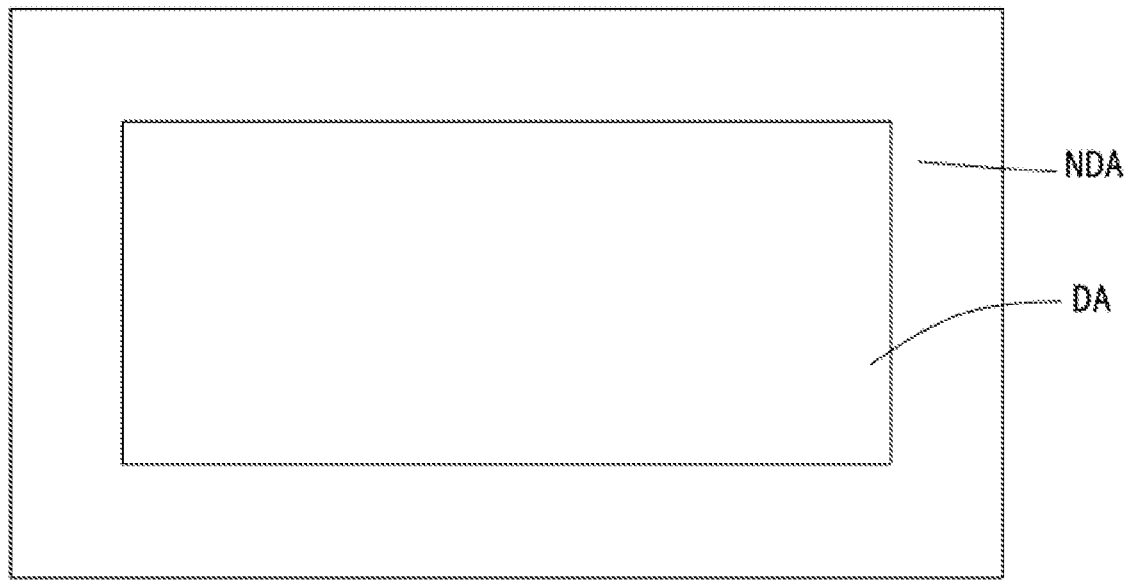
FIG. 1 is a schematic top plan view of a display panel in an embodiment of the present invention.
Figure 2:
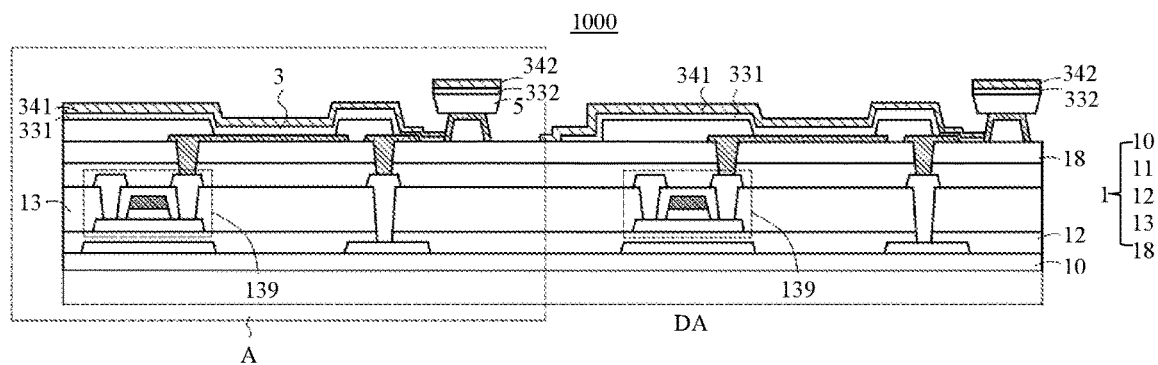
FIG. 2 is a schematic cross-sectional view of the display panel of FIG. 1.
Figure 3:
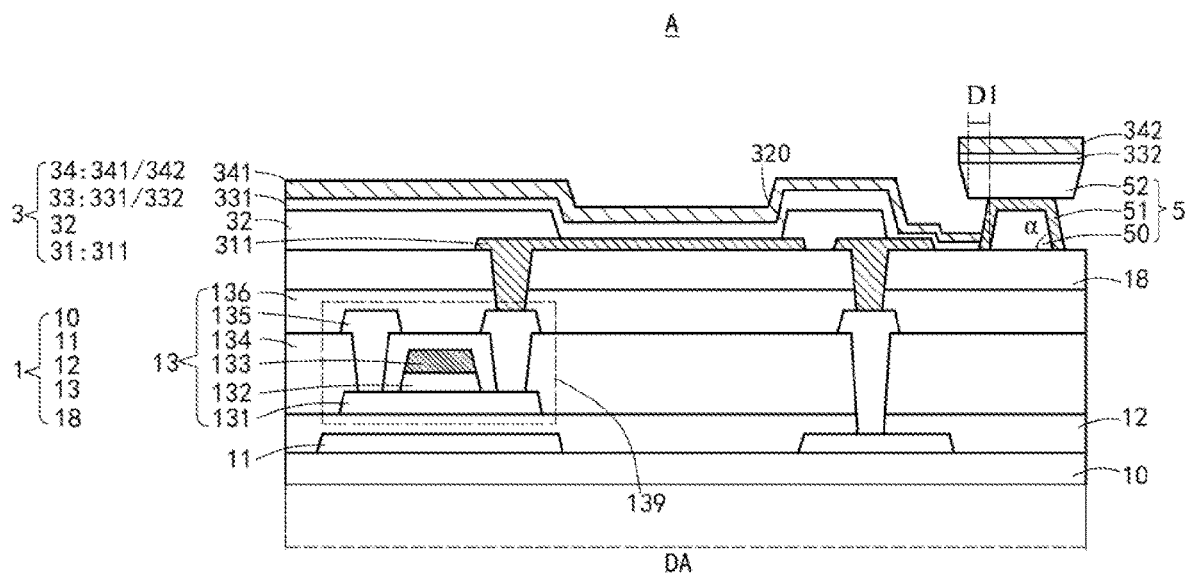
FIG. 3 is a schematic enlarged view of an A portion of FIG. 1.

As shown in FIGS. 1 to 3, an embodiment of the present invention provides a display panel 1000. Exemplarily, the display panel 1000 is an organic light-emitting diode (OLED) display panel.

Referring to FIG. 1, the display panel 1000 includes a display area DA and a non-display area NDA. The display area DA may be an area for setting sub-pixels of a display image. The non-display area NDA may be an area for providing a driving unit such as a gate driving circuit for providing a driving signal to a pixel driving circuit of a sub-pixel, and an area for disposing some wirings for providing signals for the driving unit. In the non-display area NDA, generally no sub-pixels for display are provided. The non-display area NDA may be disposed on at least one side of the display area DA to at least partially surround a periphery of the display area DA.

Referring to FIG. 3, the display panel 1000 includes an array substrate 1, a light-emitting device layer 3, and an auxiliary structure 5.

The array substrate 1 includes a substrate 10, a light shielding layer 11, a buffer layer 12, a pixel driving circuit layer 13, and a planarization layer 18.

The substrate 10 is configured to support film layers disposed thereon. The substrate 10 may include a single layer of insulating material, such as glass, quartz, and polymer resin, or a multi-layer insulating material such as a dual-layer of polymer resin. The substrate 10 may be a rigid substrate or a flexible substrate.

The light shielding layer 11 is located on the substrate 10 and is configured to shield light for a semiconductor pattern of a thin-film transistor. The light shielding layer 11 may be made of a metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The light shielding layer 11 may be a single-layer film or a multi-layer film.

The buffer layer 12 may be arranged on the light shielding layer 11. The buffer layer 12 may include a single-layer film of insulating films such as silicon nitride (SiNx) and silicon oxide (SiOx) or a multilayer film in which silicon nitride (SiNx) and silicon oxide (SiOx) are stacked. The buffer layer 12 prevents penetration of unnecessary components, such as impurities or moisture.

The pixel driving circuit layer 13 is located on the substrate 10 and includes a plurality of pixel driving circuits located in the display area DA. Exemplarily, the pixel driving circuit layer 13 includes an active layer 131, a first insulating layer 132 disposed on the active layer 131, a first metal layer 133 disposed on the first insulating layer 132, an interlayer dielectric layer 134 disposed on the first metal layer 133, a second metal layer 135 disposed on the interlayer dielectric layer 134, and a passivation layer 136 disposed on the second metal layer 135. Specifically, the active layer 131 includes a plurality of semiconductor patterns. The first metal layer 133 includes a plurality of gate electrodes, and the second metal layer 135 includes a plurality of source electrodes and a plurality of drain electrodes. The semiconductor patterns, the gate electrodes, the source electrodes, and the drain electrodes may collectively form a plurality of thin-film transistors 139. Specifically, the pixel driving circuits may include the thin-film transistors 139.

The planarization layer 18 is located on the passivation layer 136. The planarization layer 18 is typically thicker to provide a flat surface for anodic deposition. The planarization layer 18 may include inorganic insulating material or organic insulating substances, such as polyacrylates resin, epoxy resin, phenolic resin, polyamides resin, polyimides resin, unsaturated polyesters resin, polyphenylenethers resin, polyphenylenesulfides resin, or BCB: benzocyclobutene, etc. The planarization layer 18 may also include a photosensitive substance, but is not limited thereto.

The light-emitting device layer 3 is located on the pixel driving circuit layer 13 and includes a first conductive layer 31, a pixel definition layer 32, an organic layer 33, and a second conductive layer 34. At least part of the light-emitting device layer 3 is located in the display area DA.

The first conductive layer 31 includes a plurality of first electrodes 311 (i.e., anode) electrically connected to the pixel driving circuits. The anode may include a material layer with a relative high work function, such as a laminated indium tin oxide (ITO), indium zinc oxide (IZO), zinc oxide (ZnO), and indium oxide (In2O3), and a material, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a laminated film structure of reflective material layers of a mixture thereof, but not limited thereto.

The pixel definition layer 32 is disposed on the first conductive layer 31 and is provided with a plurality of openings 320 for exposing the first electrodes 311. The pixel definition layer 32 may include resins, such as polyacrylates or polyimides, and inorganic substances of silica series, etc. External light is absorbed by a material containing at least one of black pigment or dye, so that the reflectivity of the external light can be reduced and a contrast ratio of a display device can be improved.

The organic layer 33 is located on the first conductive layer 31 and includes a first portion 331 and a plurality of second portions 332. Specifically, part of the first portion 331 is located in a corresponding one of the openings 320 of the pixel definition layer 32. Exemplarily, the first portion 331 is an integral structure (due to the viewing angle, the portions denoted by two numerals 331 in FIG. 2 are actually connected to each other). The first portion 331 is provided with a plurality of openings, and the second portions 332 are disconnected from the first portion 331 at the openings. The organic layer 33 may include an organic light-emitting layer and a common layer, for example, may be fabricated by means of ink-Jet printing (IJP). The organic light-emitting layer may include an organic substance layer. The common layer may include at least one of a first common layer or a second common layer. The first common layer includes a hole injection layer and a hole transport layer, and the second common layer includes an electron injection layer and an electron transport layer.

The second conductive layer 34 is located on the organic layer 33 and includes a second electrode 341 (i.e., cathode) and a plurality of disconnected portions 342. Exemplarily, the second electrode 341 is an integral structure (due to the viewing angle, the portions denoted by two numerals 341 in FIG. 2 are actually connected to each other). The second electrode 341 is provided with a plurality of openings, and the disconnected portions 342 are disconnected from the second electrode 341 at the openings. Specifically, each of the disconnected portions 342 is located on a corresponding one of the second portion 332 of the organic layer 33. The second electrode 341 is located on the first portion 331 of the organic layer 33. Part of the first portion 331 is disposed between the first electrode 311 and the second electrode 341. Exemplarily, the second electrode 341 may be formed by evaporation or sputtering and include a material layer with a relatively small work function, such as Li, Ca, an alloy of lithium fluoride (LiF) and Ca, an alloy of LiF and Al, Al, Mg, Ag, Pt, Pd, Ni, Au, Nd, Ir, Cr, barium fluoride (BaF2), barium (Ba), or a compound or mixture thereof (e.g., a mixture of Ag and Mg, etc.). The second electrode 341 may further include a transparent metal oxide layer disposed on the material layer with the relatively small work function.

A plurality of the auxiliary structures 5 are disposed on the pixel driving circuit layer 13 and located at a side of the second electrode 341. At least one of the auxiliary structures 5 includes a base 50, an auxiliary electrode 51, and an auxiliary portion 52, and is located in the display area DA.

The base 50 is located on the pixel driving circuit layer 13 and has a substantially trapezoidal cross-section. The base 50 includes an outer side surface, a bottom surface, and a top surface. The bottom surface is close to the pixel driving circuit layer 13, the top surface is connected to the outer side surface and is disposed opposite to the bottom surface, and a length of the top surface is less than a length of the bottom surface. The outer side surface is located at an angle α with respect to a horizontal plane where the bottom surface is located, and the angle α (i.e., a slope angle, taper angle) is an acute angle. Exemplarily, the angle α is greater than or equal to 30° and less than or equal to 60°, thereby making it easier to attach the second electrode 341 to the outer side surface of the base 50. The base 50 and the planarization layer 18 or the pixel definition layer 32 can be fabricated in a same layer, so that the base 50 and the planarization layer 18 or the pixel definition layer 32 are arranged in the same layer and made of a same material, thus saving fabrication cost.

The auxiliary electrode 51 is located on the outer side surface of the base 50 and is connected to an edge of the second electrode 341 close to the auxiliary structure 5. Understandably, the auxiliary electrode 51 is connected to the second electrode 341. Since the auxiliary electrode 51 and the second electrode 341 are contact-connected with each other with a relatively large overlapping area, it can be considered that the auxiliary electrode 51 and the second electrode 341 are connected in parallel, so that resistance of the second electrode 341 can be reduced. Exemplarily, the auxiliary electrode 51 covers the top surface and the outer side surface of the base 50, which can ensure the contact-connection between the auxiliary electrode 51 and the second electrode 341. The auxiliary electrode 51 and the first electrode 311 can be fabricated at the same time, so that the auxiliary electrode 51 and the first electrode 311 can be fabricated in a same layer and made of a same material, thus saving fabrication cost.

The auxiliary portion 52 is located on the auxiliary electrode 51 and has a cross-section being roughly inverted trapezoidal or rectangular in shape. The edge of the auxiliary portion 52 exceeds a first distance DI with respect to the edge of the base 50, so that the organic layer 33 can be more easily broken at the edge of the auxiliary portion 52 and the second portion 332 is located on the auxiliary portion 52. Exemplarily, a material of the auxiliary portion 52 may include organic material or inorganic material, and the first distance DI is greater than 0.5 microns (μm). Specifically, an orthographic projection of the edge of the second electrode 341 close to the auxiliary structure 5 on the substrate 10 falls within an orthographic projection of the auxiliary portion 52 on the substrate 10.

In this embodiment, the first portion 331 and a corresponding second portion 332 of the organic layer 33 are disconnected at the edge of a corresponding auxiliary portions 52, and the second electrode 341 of the second conductive layer 34 and a corresponding disconnected portion 342 are disconnected at the edge of the corresponding auxiliary portion 52. Therefore, the organic layer 33 and the second conductive layer 34 can be separated by a plurality of the auxiliary structures 5. The base 50 is fabricated at where the second electrode 341 (i.e., the cathode) needs to be contact-connected to the auxiliary electrode, and the base 50 is covered with the auxiliary electrode 51 formed by metal coating. In this case, the slope angle of the base 50 is an acute angle, which can improve contact-connection probability of the second electrode 341 and the auxiliary electrode 51. An edge of the second electrode 341 close to the auxiliary portion 52 exceeds an edge of the first portion 331 close to the auxiliary portion 52 and is connected to the auxiliary electrode 51. By connecting the auxiliary electrode 51 and the second electrode 341 in parallel, the resistance of the second electrode 341 can be reduced, and uneven display of large-sized panels due to a voltage drop caused by cathode impedance can be improved.

In other embodiments, please refer to FIG. 2. In actual production, part of the first portion 331 of the organic layer 33 may overlap the auxiliary electrode 51 in order to ensure that the second electrode 341 and the auxiliary electrode 51 are contact-connected to each other. By controlling an evaporation angle, the second electrode 341 can overlap more area of the auxiliary electrode 51 than the first portion 331 below, that is, a contact-connection of the second electrode 341 and the auxiliary electrode 51 on the base 50 is larger than a contact-connection of the first part 331 and the auxiliary electrode 51 on the base 50, In other embodiments, heights of the auxiliary structures 5 are consistent and evenly distributed in the display area DA, so that contact-connection between the second electrodes 341 and the auxiliary electrodes 51 can be more uniform, thus ensuring consistency of in-plane cathode resistance.

In possible embodiments, by controlling an evaporation process of the second electrode 341, the second electrode 341 may not be disconnected from the disconnected portions 342, and the second electrode 341 may be whole surface in form, which can further improve uniformity of the in-plane cathode resistance.

In possible embodiments, the display panel further includes an encapsulation layer disposed on the light-emitting device layer 3 and the auxiliary structure 5. The encapsulation layer includes a first inorganic encapsulation layer, a first organic encapsulation layer, and a second inorganic encapsulation layer arranged in a stacked manner. Part of the encapsulation layer on the auxiliary structure 5 extends along an outline of the auxiliary structure 5. For example, part of the first inorganic layer and part of the second inorganic layer extend along the outline of the auxiliary structure 5. The organic layer 33 may be continuous or broken at the edge of the auxiliary portion 52 of the auxiliary structure 5. Thus, an encapsulation effect on the sub-pixels in the display area DA can be enhanced.

Further, as required, at least one auxiliary structure 5 may also be disposed in the non-display area NDA and may double as a retaining wall structure. Specifically, the first inorganic layer and the second inorganic layer double as a retaining wall structure on the auxiliary structure 5. The organic layer 33 is located on a side of the auxiliary structure 5 doubling as the retaining wall structure near a center of the display panel.

Further, the display panel further includes a first retaining wall disposed on the pixel driving circuit layer 13. The first retaining wall is located away from a side of the auxiliary structure 5 doubling as the retaining wall structure away from the center of the display panel. The first inorganic layer and the second inorganic layer are also located on the first retaining wall, and the organic layer 33 is located on a side of the first retaining wall close to the center of the display panel. A top of the first retaining wall is higher than a top of the auxiliary structure 5. In this embodiment, the first retaining wall can be configured as a main retaining wall with a larger height, and the auxiliary structure 5 located in the non-display area NDA of the display panel double as an auxiliary structure with a less height. The retaining wall can further ensure the encapsulation performance.

Embodiments of the present invention further provide a display device including the above-mentioned display panel 1000. The display device is a device with a display function. Exemplarily, the display device may be a device that displays video or still images and may be fixed terminals, such as televisions, desktop computers, monitors, and billboards, and may also include mobile terminals, such as mobile phones, tablets, mobile communication terminals, electronic notepads, electronic books, multimedia players, navigators, notebook computers, and may also include wearable electronic devices, such as smart watches, smart glasses, virtual reality devices, and augmented reality devices.

The above describes in detail the embodiments of the present invention. Specific examples are used in this article to illustrate the principles and implementation of the invention, and the descriptions of the above examples are only used to help understand the methods and core ideas of the invention; In addition, for those skilled in the art, according to the idea of the invention, there will be changes in the specific implementation and the scope of invention. In summary, the content of this specification should not be construed as a limitation of the invention.

What is claimed is:

1. A display panel, comprising:
   an array substrate comprising a substrate and a pixel driving circuit layer disposed on the substrate, wherein the pixel driving circuit layer comprises a pixel driving circuit;
   a light-emitting device layer disposed on the pixel driving circuit layer and comprising a first conductive layer, an organic layer disposed on the first conductive layer, and a second conductive layer disposed on the organic layer, wherein the first conductive layer comprises a first electrode electrically connected to the pixel driving circuit, the organic layer comprises a first portion, the second conductive layer comprises a second electrode disposed on the first portion, and part of the first portion is located between the first electrode and the second electrode; and an auxiliary structure disposed on the pixel driving circuit layer and comprising a base, an auxiliary electrode located on an outer side surface of the base, and an auxiliary portion located on the base;

wherein a cross-section of the base is trapezoidal in shape, and an edge of the second electrode close to the auxiliary portion exceeds an edge of the first portion close to the auxiliary portion and is connected to the auxiliary electrode; and wherein the base further comprises a top surface connected to the outer side surface and disposed opposite to a bottom surface of the base, and the auxiliary electrode covers the top surface and the outer side surface.

2. The display panel of claim 1, wherein the organic layer further comprises a second portion located on the auxiliary portion, the first portion and the second portion are disconnected at an edge of the auxiliary portion, the second conductive layer further comprises a disconnected portion disposed on the second portion, and the second electrode and the disconnected portion are disconnected at the edge of the auxiliary portion.

3. The display panel of claim 1, wherein the second electrode is contact-connected to the auxiliary electrode with a contact-connection area larger than a contact-connection area between the first portion and the auxiliary electrode.

4. The display panel of claim 1, wherein the auxiliary electrode and a plurality of the first electrodes are disposed in a same layer and made of a same material.

5. The display panel of claim 1, wherein the array substrate further comprises a planarization layer disposed between the pixel driving circuit layer and the first conductive layer, the light-emitting device layer further comprises a pixel definition layer disposed between the planarization layer and the organic layer, and the base and the planarization layer or the pixel definition layer are arranged in a same layer and made of a same material.

6. The display panel of claim 1, wherein an orthographic projection of the edge of the auxiliary portion on the substrate exceeds a boundary of an orthographic projection of the base on the substrate.

7. The display panel of claim 6, wherein the orthographic projection of the edge of the auxiliary portion on the substrate exceeds the boundary of the orthographic projection of the base on the substrate by 0.5 microns (µm) or more, and an orthographic projection of the edge of the second electrode close to the auxiliary structure on the substrate falls within an orthographic projection of the auxiliary portion on the substrate.

8. The display panel of claim 1, wherein the outer side surface of the base is located at an angle greater than or equal to 30° and less than or equal to 60° with respect to the bottom surface of the substrate.

9. A display panel, comprising:
an array substrate comprising a substrate and a pixel driving circuit layer disposed on the substrate, wherein the pixel driving circuit layer comprises a pixel driving circuit;

a light-emitting device layer disposed on the pixel driving circuit layer and comprising a first conductive layer, an organic layer disposed on the first conductive layer, and a second conductive layer disposed on the organic layer, wherein the first conductive layer comprises a first electrode electrically connected to the pixel driving circuit, the organic layer comprises a first portion, the second conductive layer comprises a second electrode disposed on the first portion, and part of the first portion is located between the first electrode and the second electrode; and an auxiliary structure disposed on the pixel driving circuit layer and comprising a base, an auxiliary electrode located on an outer side surface of the base, and an auxiliary portion located on the base;

wherein a cross-section of the base is trapezoidal in shape, and an edge of the second electrode close to the auxiliary portion exceeds an edge of the first portion close to the auxiliary portion and is connected to the auxiliary electrode.

10. The display panel of claim 9, wherein an edge of the second electrode close to the auxiliary structure exceeds an edge of the first portion close to the auxiliary structure and is connected to the auxiliary electrode.

11. The display panel of claim 10, wherein the organic layer further comprises a second portion located on the auxiliary portion, the first portion and the second portion are disconnected at an edge of the auxiliary portion, the second conductive layer further comprises a disconnected portion disposed on the second portion, and the second electrode and the disconnected portion are disconnected at the edge of the auxiliary portion.

12. The display panel of claim 10, wherein the second electrode is contact-connected to the auxiliary electrode with a contact-connection area larger than a contact-connection area between the first portion and the auxiliary electrode.

13. The display panel of claim 9, wherein the auxiliary electrode and a plurality of the first electrodes are disposed in a same layer and made of a same material.

14. The display panel of claim 9, wherein the base further comprises a top surface connected to the outer side surface and disposed opposite to a bottom surface of the base, and the auxiliary electrode covers the top surface and the outer side surface.

15. The display panel of claim 9, wherein the array substrate further comprises a planarization layer disposed between the pixel driving circuit layer and the first conductive layer, and the light-emitting device layer further comprises a pixel definition layer disposed between the planarization layer and the organic layer, wherein the base and the planarization layer or the pixel definition layer are arranged in a same layer and made of a same material.

16. The display panel of claim 10, wherein an orthographic projection of the edge of the auxiliary portion on the substrate exceeds a boundary of an orthographic projection of the base on the substrate.

17. The display panel of claim 16, wherein the orthographic projection of the edge of the auxiliary portion on the substrate exceeds the boundary of the orthographic projection of the base on the substrate by 0.5 microns (µm) or more, and an orthographic projection of the edge of the second electrode close to the auxiliary structure on the substrate falls within an orthographic projection of the auxiliary portion on the substrate.

18. The display panel of claim 16, wherein the cross-section of the auxiliary portion is inverted trapezoidal in shape or rectangular in shape.

19. The display panel of claim 9, wherein the outer side surface of the base is located at an angle greater than or equal to 30° and less than or equal to 60° with respect to the bottom surface of the substrate.

20. A display device, comprising the display panel of claim 1.

* * * * *